United States Patent
Bhattacharya

(10) Patent No.: US 7,611,573 B2
(45) Date of Patent: Nov. 3, 2009

(54) ZNS/ZN(O,OH)S-BASED BUFFER LAYER DEPOSITION FOR SOLAR CELLS

(75) Inventor: Raghu N. Bhattacharya, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 632 days.

(21) Appl. No.: 10/592,963

(22) PCT Filed: Apr. 2, 2004

(86) PCT No.: PCT/US2004/010415

§ 371 (c)(1),
(2), (4) Date: Sep. 13, 2006

(87) PCT Pub. No.: WO2005/105944

PCT Pub. Date: Nov. 10, 2005

(65) Prior Publication Data

US 2009/0191359 A1     Jul. 30, 2009

(51) Int. Cl.
*C09K 3/00* (2006.01)
*H01L 31/0296* (2006.01)
*H01L 31/032* (2006.01)
*B05D 5/00* (2006.01)

(52) U.S. Cl. .............. 106/286.6; 106/287.18; 427/74; 427/226; 136/265; 423/99; 423/512.1; 423/566.1

(58) Field of Classification Search ............ 106/286.6, 106/287.18; 427/74, 226; 136/265; 423/99, 423/512.1, 566.1
See application file for complete search history.

(56) References Cited

U.S. PATENT DOCUMENTS

| | | | |
|---|---|---|---|
| 4,581,108 A | 4/1986 | Kapur et al. | |
| 4,612,411 A | 9/1986 | Wieting et al. | |
| 5,078,803 A | 1/1992 | Pier et al. | |
| 5,112,410 A | 5/1992 | Chen | |
| 5,474,939 A | 12/1995 | Pollock et al. | |
| 5,486,238 A | 1/1996 | Nakagawa et al. | |
| 5,731,031 A | 3/1998 | Bhattacharya et al. | |
| 5,871,630 A | 2/1999 | Bhattacharya et al. | |
| 5,948,176 A | 9/1999 | Ramanathan et al. | |
| 6,061,977 A | 5/2000 | Toyama et al. | |
| 6,259,016 B1 | 7/2001 | Negami et al. | |
| 6,372,538 B1 | 4/2002 | Wendt et al. | |
| 6,534,704 B2 | 3/2003 | Hashimoto et al. | |
| 2002/0043278 A1 | 4/2002 | Hashimoto et al. | |
| 2002/0043279 A1 | 4/2002 | Karg | |

*Primary Examiner*—David M Brunsman
(74) *Attorney, Agent, or Firm*—John C. Stolpa

(57) ABSTRACT

The invention provides CBD ZnS/Zn(O,OH)S and spray deposited ZnS/Zn(O,OH)S buffer layers prepared from a solution of zinc salt, thiourea and ammonium hydroxide dissolved in a non-aqueous/aqueous solvent mixture or in 100% non-aqueous solvent. Non-aqueous solvents useful in the invention include methanol, isopropanol and triethyl-amine. One-step deposition procedures are described for CIS, CIGS and other solar cell devices.

20 Claims, 10 Drawing Sheets

ZNS/ZN(O,OH)S-BASED BUFFER LAYER DEPOSITION FOR SOLAR CELLS

GOVERNMENT INTEREST

The United States Government has rights in this invention pursuant to contract DEAC36-99CH10093 between the United States Department of Energy and the National Renewable Energy Laboratory, a division of the Midwest Research Institute.

TECHNICAL FIELD

The field of the present invention relates to methods and compositions useful in the deposition of buffer layers for CIGS, CIGSS and other solar cell and semiconductor devices. More particularly, the present invention relates to solvents having at least a portion of a non-aqueous component useful in thin film buffer layer deposition via chemical bath and/or spray deposition methods.

DISCLOSURE OF THE INVENTION

The sun provides more energy to the Earth in one minute than is consumable by the world during the course of a whole year. Capture and use of this energy has, and continues to be, of vital importance to the world due to its high abundance and inherently clean nature. This is especially true in view of the diminishing supplies, and higher levels of pollution, associated with the conversion of fossil fuel into energy. Traditionally, capture and use of sunlight is accomplished by solar or photovoltaic cells, where the cells directly convert sunlight into electricity. Fabricating high efficiency photovoltaic devices is dependent upon thin layers of semiconducting materials, where sunlight strikes a junction region and a current passes across it. Typically, this current is captured by onboard circuitry.

CIGS [$Cu(In,Ga)Se_2$] and CIGSS [$Cu(In,Ga)(S,Se)_2$] films combined with an n-type CdS layer, for use in solar cells, has become the subject of considerable interest and study in recent years. The formation of CIGS/CdS solar cells provides a large optical absorption coefficient, extremely thin layers and resultant long-term stability. A critical element of CIGS photovoltaic technology is the junction-formation step, where a thin chemical bath deposition of CdS layer is accomplished. Relatively high efficient devices have been fabricated, some devices showing up to 19% efficiency.

Recently, ZnS layer substitution for CdS has resulted in devices with comparable efficiencies, while maintaining a wide optical bandgap without the environmental concerns inherent in cadmium use. However, in order to achieve proper layer thickness, multiple ZnS deposition steps have been required, i.e., up to three or four independent deposition steps. Multiple deposition steps require cleaning and reapplication in-between each deposition, thereby increasing the time, effectiveness and costs of the procedure. As such there is a need in the industry to replace CdS with ZnS using a one-step deposition procedure. In addition, recent attempts to deposit ZnS layers using standard chemical bath deposition technology have resulted in higher levels of hydroxides and oxides incorporation, thereby requiring extensive heat treatments and resulting in lowering the overall efficiencies of the devices. As such, there is also a need in the industry to provide high or quality ZnS buffer layers for use in CIGS, CIGSS and other like devices.

Against this backdrop the present invention has been developed.

SUMMARY OF THE INVENTION

The present invention provides compositions and methods for the fabrication of CIGS or CIGSS/buffer layer devices using modified chemical bath deposition. Embodiments of the present invention utilize chemical bath reactions in a solvent comprising at least a portion of a non-aqueous component and often being composed of a combination of non-aqueous solvent and aqueous solvent. In addition, one-step chemical bath deposition processes are achieved due to enhanced thickness parameters of target buffer layers resultant from the mixture of non-aqueous and aqueous solvents during these same reactions, i.e., solvents having at least some portion provided by an organic solvent. In some embodiments, the solvent is composed of 100% organic material, for example 100% methanol.

The present invention also provides compositions and methods for the fabrication of CIGS or CIGSS/buffer layer devices using spray deposition. Embodiments of the present invention utilize spray deposition reactions in mixed non-aqueous/aqueous solvents. As with chemical bath deposition, one-step deposition processes are achieved due to enhanced thickness parameters of target buffer layers resultant from these modified solvents, i.e., solvents having at least some portion provided by an organic solvent.

In preferred embodiments, the present invention provides compositions and methods for the fabrication of CIGS/ZnS absorbers using a solvent mixture of non-aqueous and aqueous components in either a chemical bath or spray deposition. The non-aqueous solvent can be an alcohol, the alcohol preferably being methanol. In some embodiments, the non-aqueous portion is 100% of the solvent.

The present invention also provides methods for fabricating buffer layers using the modified solvents and can include cleaning the deposited buffer layer ultrasonically.

These and various other features as well as advantages, which characterize the invention, will be apparent from a reading of the following detailed description and a review of the appended claims.

DETAILED DESCRIPTION OF THE INVENTION

Figure 1:
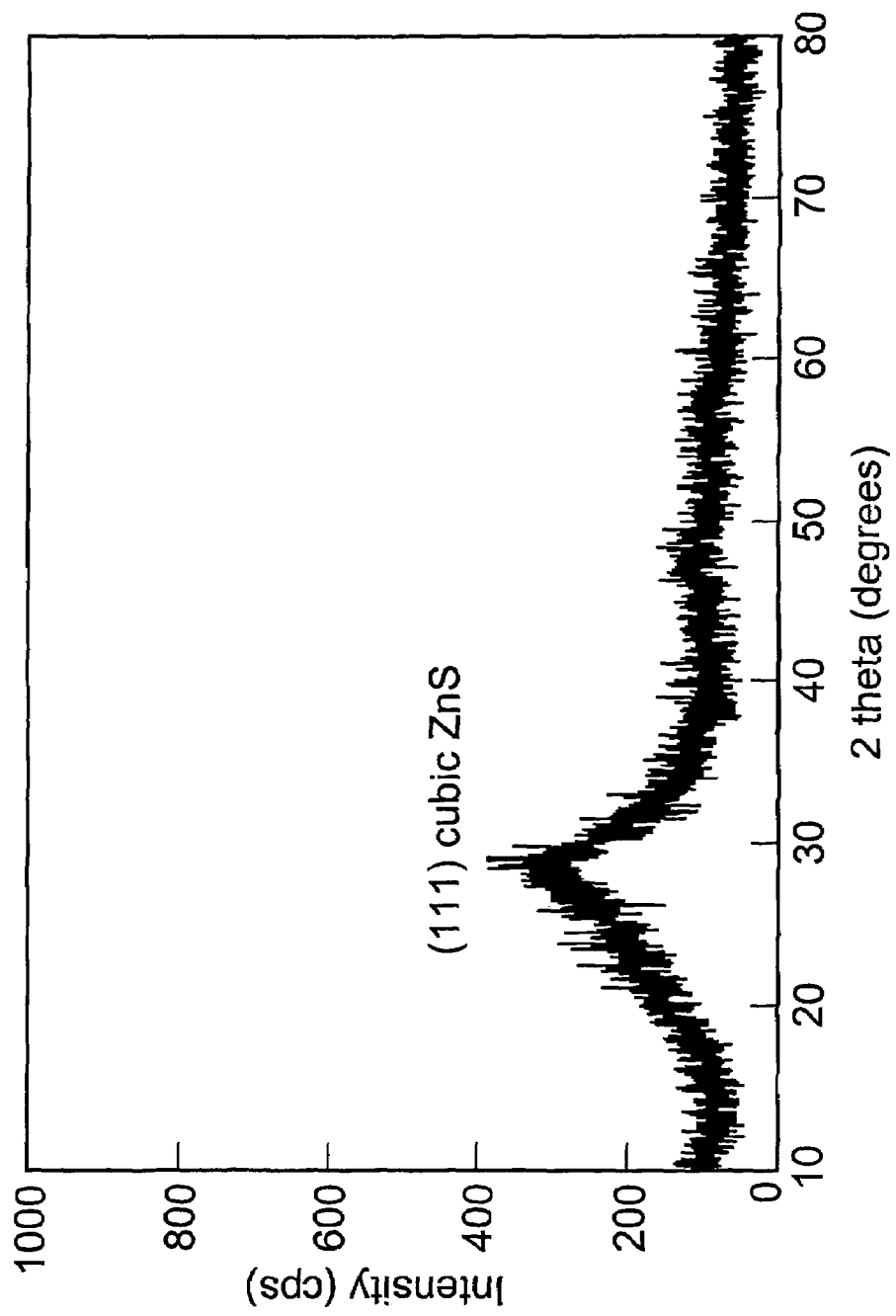
FIG. 1 illustrates an X-ray diffraction spectrum of as-deposited chemical bath deposited ZnS film on a glass substrate in accordance with one embodiment of the present invention.

The present invention provides for several deposition processes preferably chemical bath deposition and spray deposition of buffer layers useful in CIGS, CIGSS and other solar cell and semiconductor devices. The present invention provides methods and compositions useful in the deposition of buffer layers for these devices, and in particular provides reactant solvents composed of at least some portion of a non-aqueous solvent. In preferred embodiments the buffer layer is ZnS and the non-aqueous based solvent is an alcohol. The present invention also provides methods for chemical bath or spray deposition of ZnS onto appropriate substrates, including the use of an alcohol based solvent. The invention includes one-step deposition methods that result in the fabrication of high quality solar cell and semiconductor devices. In addition, methods of the invention can include ultrasonically cleaning the ZnS/Zn(O,OH)S layers of the invention for a predefined length of time.

Definitions:

The following definitions are provided to facilitate understanding of certain terms used herein and are not meant to limit the scope of the present disclosure.

"Non-aqueous/aqueous solvent" refers to solvents for use in chemical bath, spray and other like deposition methods having at least some percentage of the whole as a non-aqueous material. Within the context of the present invention, any mixture of alcohol-based solvent, including methanol, isopropanol, butanol, and the like, is considered representative of a non-aqueous/aqueous solvent. Other organic based materials can be mixed with water to provide a non-aqueous/aqueous solvent, for example—triethyl amine, dimethyl sulfoxide, acetone and the like. In addition, mixtures of alcohol and other organic materials can be used to prepare the non-aqueous/aqueous solvents of the invention.

"Substrate" refers to a layer of Mo on soda-lime glass, amorphous 7059 glass or other like materials, which are well known in the industry.

"CIGS" refers to devices that exhibit photovoltaic characteristics having a precursor film comprising $Cu_xIn_yGa_2Se_n$ (x=0–2, y=0–2, z=0–2, n=0–3) and a buffer layer prepared via chemical bath deposition or spray deposition. Preferable CIGS based devices have a ZnS(O, OH) buffer layer.

"Chemical bath deposition" refers generally to the process of mixing target molecules together in a deposition bath.

"Spray deposition" refers generally to the process of spraying mixed target molecules to a surface as is known in the industry.

Non-Aqueous Solvents of the Invention

High quality, high efficiency CIGS (for purposes of the present invention CIGS and CIGSS will be described as one and the same) thin film photovoltaic cells, and in particular solar cells, typically employ either a CdS or ZnS buffer layer. The present invention provides methods and compositions useful in the fabrication of either CdS, ZnS or other like based buffer layers. However, as will be clear from a review of the following disclosure, as the same general principles apply to either buffer combination, only one will be described in detail. As such, the following description is dedicated to CIGS devices that incorporate ZnS, although it is envisioned that CdS based buffer layers, as well as other like buffer layers, are also within the scope of the present invention. Note that ZnS is presently believed preferable to CdS based buffer layers due to its equivalent or better optical bandgap and its much-reduced effects on the environment.

ZnS is deposited by a deposition process, preferably chemical bath deposition from a solution of zinc salt, preferably $ZnSO_4$, an amine like an ammonium based compound, preferably $NH_4OH$, and a source of sulfur, for example thiourea. Several illustrative concentration ranges of each constituent are shown in Table 1. Note that the overall pH of the reaction should be basic, and is preferably from about 8 to about 14. Embodiments of the present invention reacting the above materials in a non-aqueous/aqueous solvent of the present invention. Note that the amine need not always be included in the deposition, but is considered preferable. As discussed in greater detail below, solvents composed of both a non-aqueous component and aqueous component facilitate high quality buffer layer deposition.

TABLE 1

Chemical concentration ranges useful in film deposition of ZnS at 25° to 100° C. for 5 to 120 minutes which result in films having a thickness of from about 100 Å to 1000 Å ZnS.

| $ZnSO_4$ (M) | Thiourea (M) | $NH_4OH$ (M) |
|---|---|---|
| 0.1 | 0.4 | 5 |
| 0.124 | 0.64 | 8 |
| 0.3 | 0.8 | 6 |

A number of different chemical bath deposition parameters can be used in the context of the present invention. In each case, the ZnS deposition was optimized by using a solvent comprising a mixture of non-aqueous and aqueous solvents in the chemical bath deposition. Presence of non-aqueous solvent provides a significantly better environment as compared to 100% aqueous solvent, for ZnS deposition, as it results in thicker film deposition, shows significantly lower hydroxide and oxide formation within the layer and facilitates Zn diffusion as compared to the standard in the art aqueous solvent—water. Importantly, lower hydroxide, and oxide formation limits the need for extensive heat treatment of the resultant ZnS layer.

Zn salt, sulfur containing compounds, and ammonium-based compounds are mixed in a bath with from 5% to 100% non-aqueous solvent, and preferably from 10 to 60% non-aqueous solvent, and most preferably from 25% to 30% non-aqueous solvent. A number of different compounds can be used to prepare the non-aqueous solvent portion of the non-aqueous/aqueous solvent mixture of the invention, for example, embodiments of the invention can include any organic based solvent. Illustrative examples of non-aqueous solvents include but are not limited to: mixtures of alcohol, e.g., methanol, isopropyl alcohol, butyl alcohol, and the like, and from triethyl amine, dimethylsulfoxide, acetone and the like. Preferably, the non-aqueous solvent is methanol from about 25% to about 30% total in the chemical bath deposition solvent. Note that the non-aqueous solvent portion of the non-aqueous/aqueous solvent mixture of the present invention can be contributed by two or more different organic compounds, for example, mixtures of methanol and triethyl amine to give a final % organic within the non-aqueous/aqueous solvent. Note also that 100% organic solvent solutions can be used as well in the context of the present invention, for example a solvent composed of 100% methanol.

Chemical bath deposition processes using the above described embodiments of the present invention result in ZnS deposition layers having a thickness of from about 100 Å to 1000 Å. A series of depositions may be performed to obtain proper film thickness. Preferably, only one deposition step is required using the non-aqueous solvent embodiments of the invention to provide film layers having the above pre-described thicknesses. One-step deposition using the non-aqueous solvent is therefore preferred.

In an alternative embodiment, ZnS is deposited by spray deposition from a solution of Zn salt, preferably $ZnSO_4$, an amine, for example ammonium based compound, preferably $NH_4OH$, and a source of sulfur, for example thiourea. As above, a solvent comprising at least a portion of non-aqueous material is used within the reaction solvent to maximize the quality and efficiency of the deposited ZnS. Illustrative examples of non-aqueous solvents for use in the non-aqueous/aqueous solvent for spray deposition include methanol, isopropyl alcohol, butyl alcohol, and the like.

Methods of the present invention provide mixing the Zn salt, amine, and sulfur containing source in a solvent based on at least a portion of a non-aqueous solvent. The deposition or contact step is preferably performed only once. Note that contact can include dipping (chemical bath deposition), spraying (spray deposition) and the like. The deposited layer of ZnS or other like layer is then cleaned ultrasonically for from about 10 to about 60 seconds to maximize buffer layer quality. The deposited layer can also be cleaned ultrasonically during chemical bath deposition of ZnS/Zn(O, OH)S layers.

Solar Cells

The present invention provides CIGS/ZnS solar cells fabricated using the non-aqueous/aqueous solvent based chemical bath or spray deposition processes of the present invention. ZnS buffer layers deposited using embodiments of the present invention resulted in comparable or better J-V characteristics, current density, $V_{oc}$, $R_s$, and FF to devices having ZnS deposited using water or other like aqueous only solvents. In addition, film thickness or required junction formation which also include Zn diffusion was achieved in a one-step deposition with the mixture of non-aqueous/aqueous solvent, as compared to an average of three or four deposition steps where an aqueous solvent was utilized.

Note that deposition of ZnS using a non-aqueous solvent can be performed on most if not all substrates. XRD and optical investigations have confirmed the deposition of ZnS using the methods of the present invention and provide overall efficiencies of from between about 14% and about 18%.

It is envisioned that buffer layers useful in other photovoltaic devices can also be deposited using a solvent based on a portion of a non-aqueous material. For example, CdS, InS, In(OH)S, CdSe, ZnSe, Zn(OH)Se, $In_2S_3$, $In_2Se_3$, In(OH)Se and other layers can all be deposited using the above methods and compositions. In each case, the parameters described above are illustrative of the invention.

Having generally described the invention, the same will be more readily understood by reference to the following examples, which are provided by way of illustration and are not intended as limiting.

EXAMPLES

Example 1

Formation of ZnS Film for Use in a Cu(In, Ga)Se2 (CIGS) and CIGSS Absorbers

A thin film containing copper, indium, gallium, and selenium was deposited on a glass substrate as described in U.S. Pat. Nos. 5,356,839, 5,436,204, 5,441,897, 5,730,852, 5,871, 630 but not limited to, which are incorporated by reference in their entirety. A precursor layer was formed having a final composition of $CuIn_{1-x}Ga_xSe_2$. Chemical bath deposition (CBD) of about 300 Å ZnS film was prepared from a solution mixture of zinc sulfate, thiourea, and ammonium hydroxide dissolved in a 50% methanol solution. In particular, 15 grams of thiourea was mixed into 250 ml of water; and 5 grams of zinc sulfate or 4.2 grams of zinc chloride was mixed into 250 ml methanol and 250 ml water solution having 55 ml of ammonium hydroxide (28%-30%). Depositions solution temperature was approximately 30-90° C. and deposition time was approximately ten to 120 minutes. In some instances, the deposited ZnS/Zn(O,OH)S layer was annealed in air at 200° C.

Spray deposition parameters included mixing 3 g thiourea with 0.84 g $ZnCl_2$ in 70 ml methanol. Alternatively, 3 g thiourea was mixed with 0.84 g $ZnCl_2$ in 70 ml methanol with 11 ml $NH_4OH$. Spray of the mixture was conducted on a CIGS absorber having a temperature of 50-80° C. for 3 to 5 minutes.

FIG. 1 illustrates an X-ray diffraction spectrum of an as deposited ZnS film on a glass substrate using the above discussed chemical bath deposition parameters in a CIGS absorber. The results from the figure indicate the presence of ZnS film deposited on the substrate.

Figure 2:
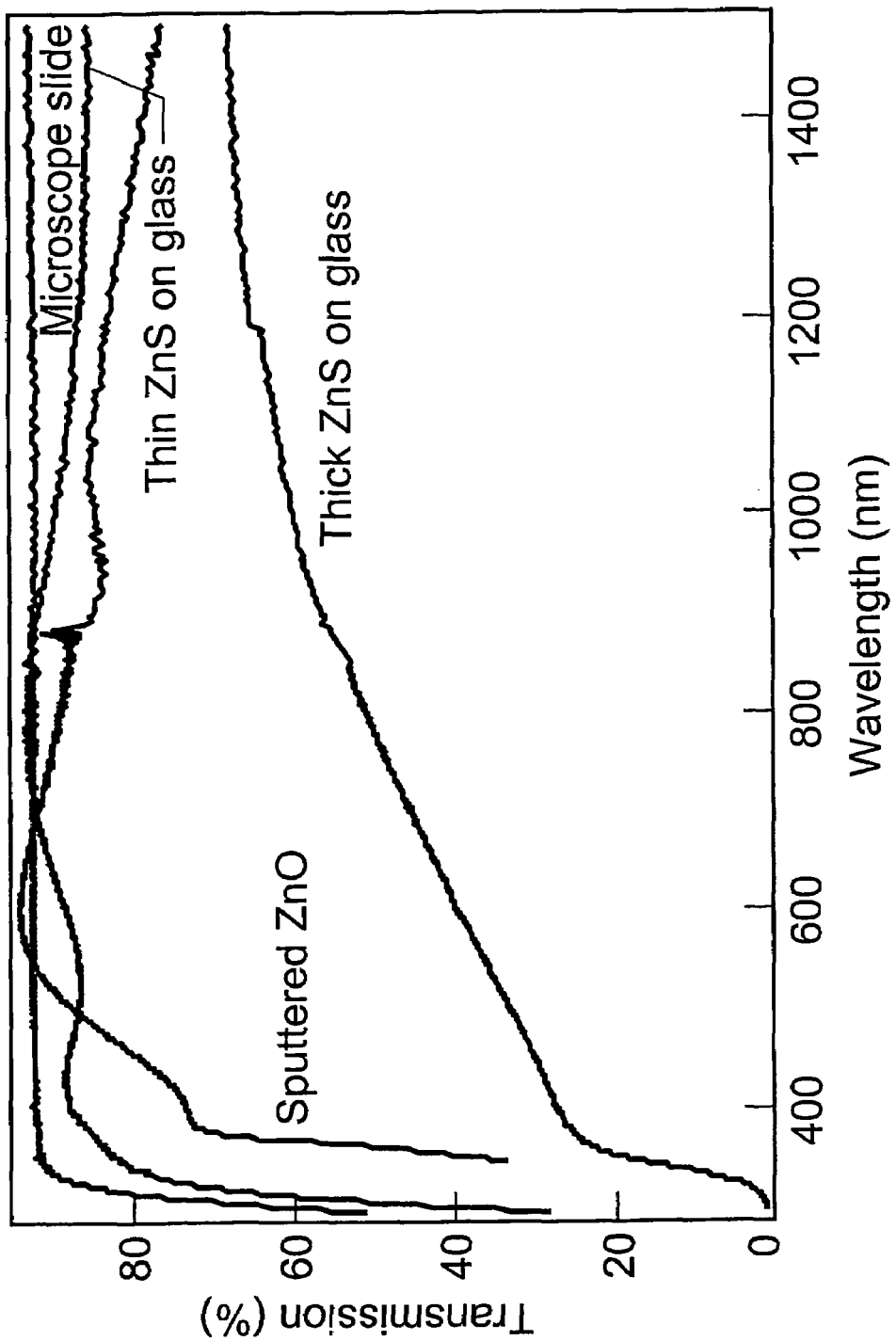
FIG. 2 is a transmission spectra of spray deposited ZnS, which is compared with standard ZnO, and soda lime glass in accordance with one embodiment of the present invention.

FIG. 2 is a transmission spectra of spray deposited ZnS which compared with standard sputtered deposited ZnO, and soda lime glass in accordance with the above described parameters.

Figure 3:
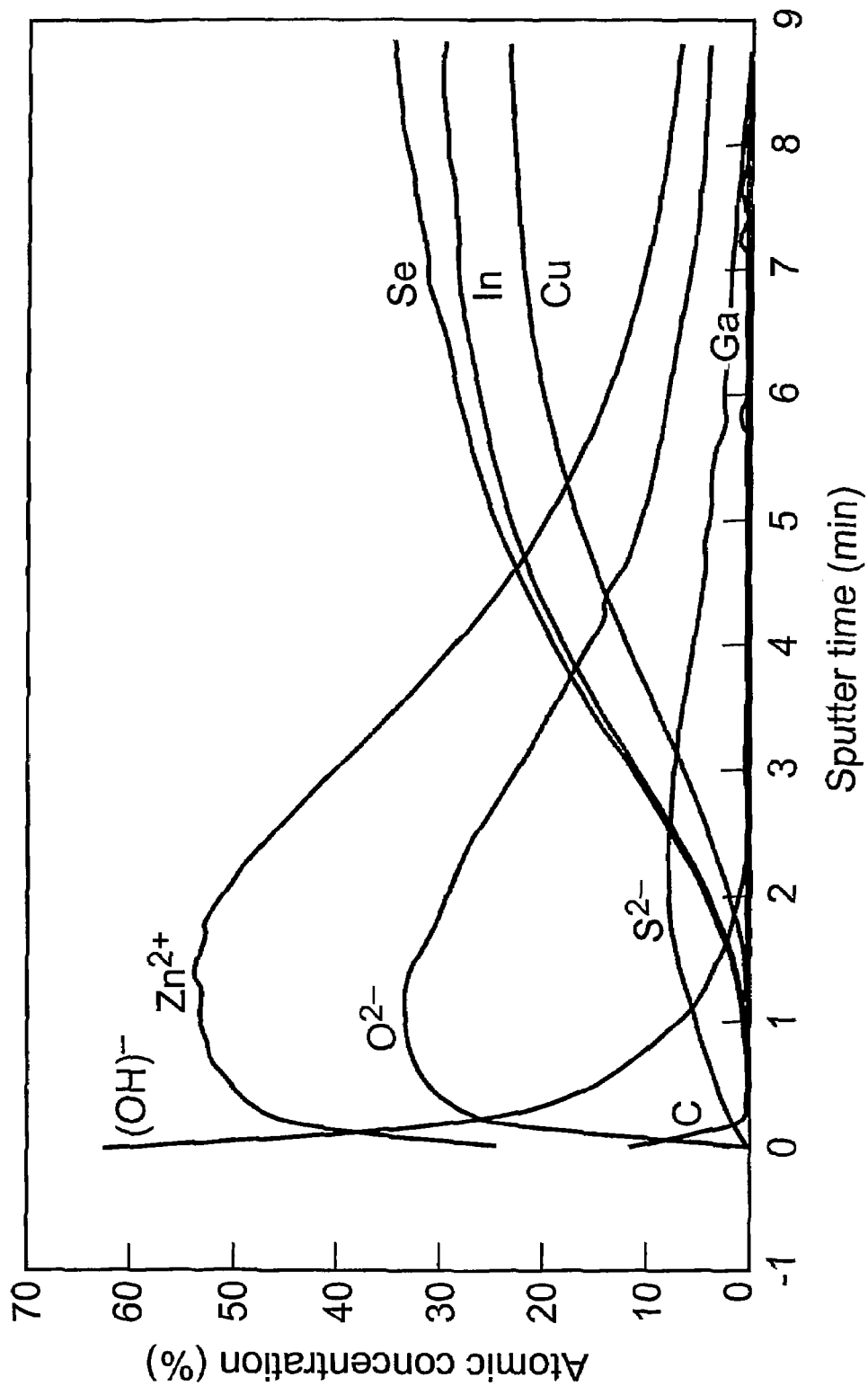
FIG. 3 illustrates XPS data of one layer chemical bath deposition ZnS that was deposited on Glass/Mo/CIGSS in accordance with one embodiment of the present invention.

FIG. 3 illustrates XPS data of one-layer chemical bath deposition ZnS that was deposited on CIGSS in accordance with the above-described parameters.

Figure 4:
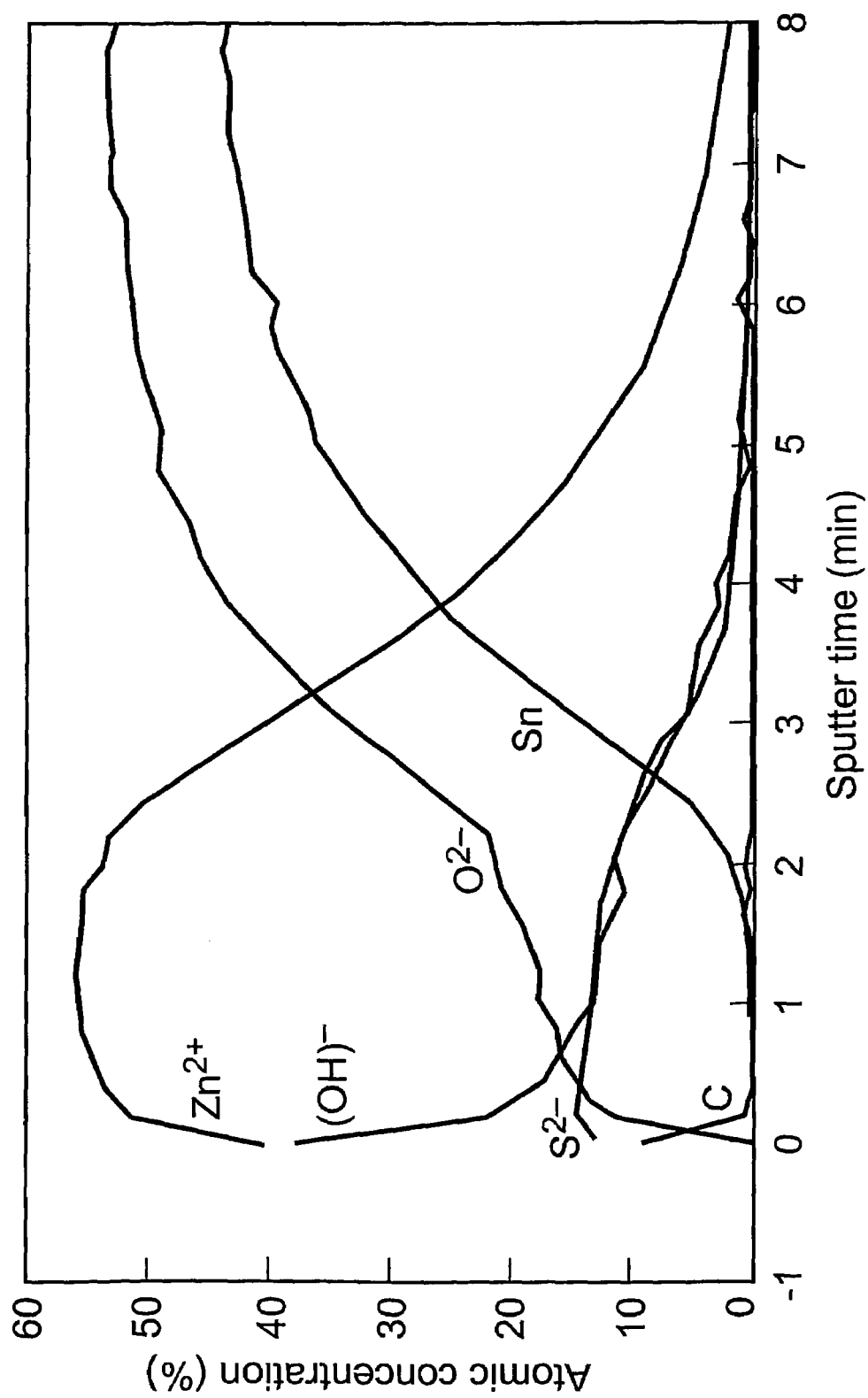
FIG. 4 illustrates XPS data of one-layer chemical bath deposition on Glass/Mo/CIGSS absorber in accordance with one embodiment of the present invention.

FIG. 4 illustrates XPS data of one-layer chemical bath deposition on Mo/CIGSS absorber in accordance with one embodiment of the present invention.

Figure 5:
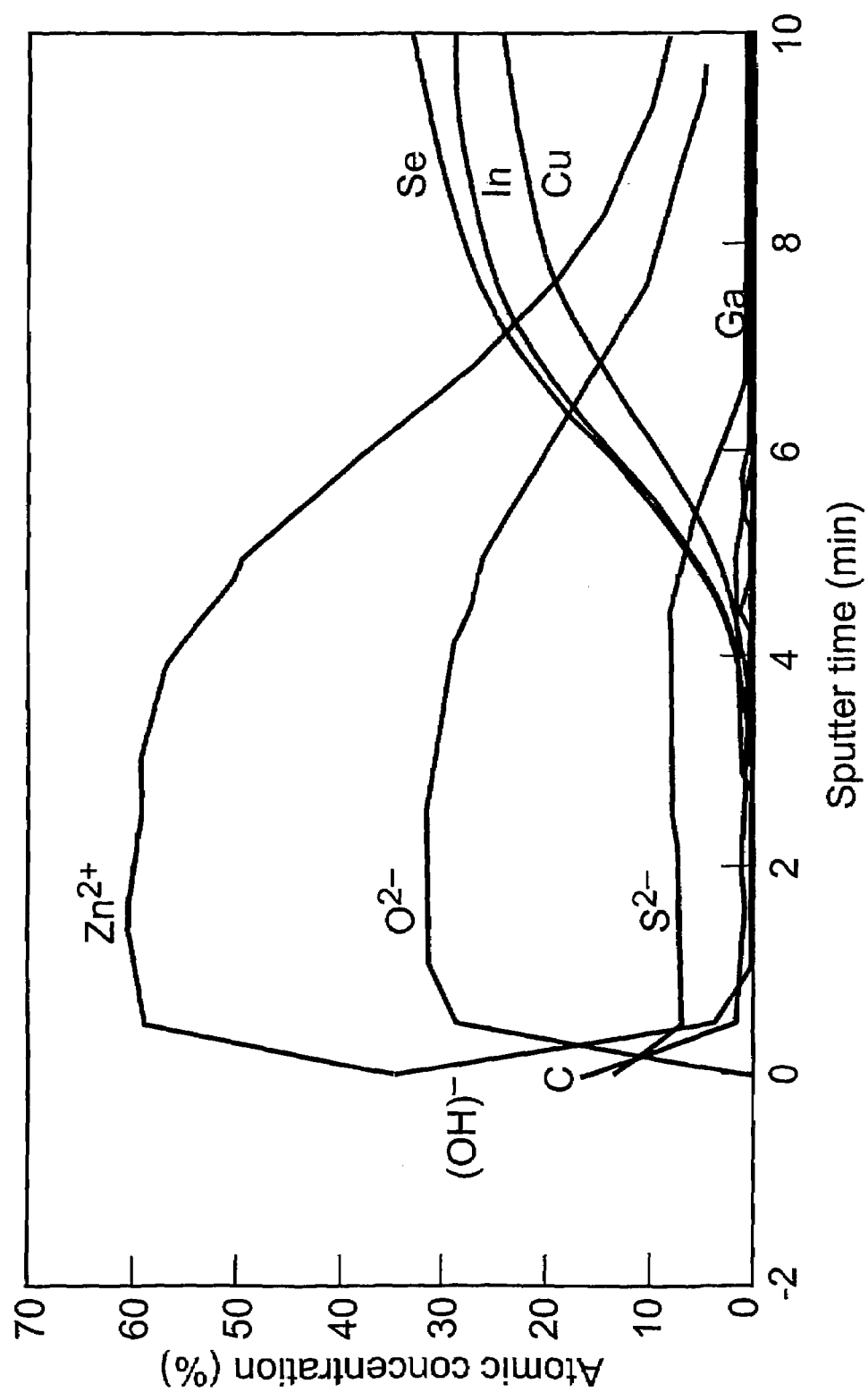
FIG. 5 illustrates XPS data of two-layer chemical bath deposition ZnS deposited on a Glass/Mo/CIGS absorber in accordance with one embodiment of the present invention.

FIG. 5 illustrates XPS data of two-layer chemical bath deposition ZnS deposited on Mo/CIGS absorber in accordance with one embodiment of the present invention.

Figure 6:
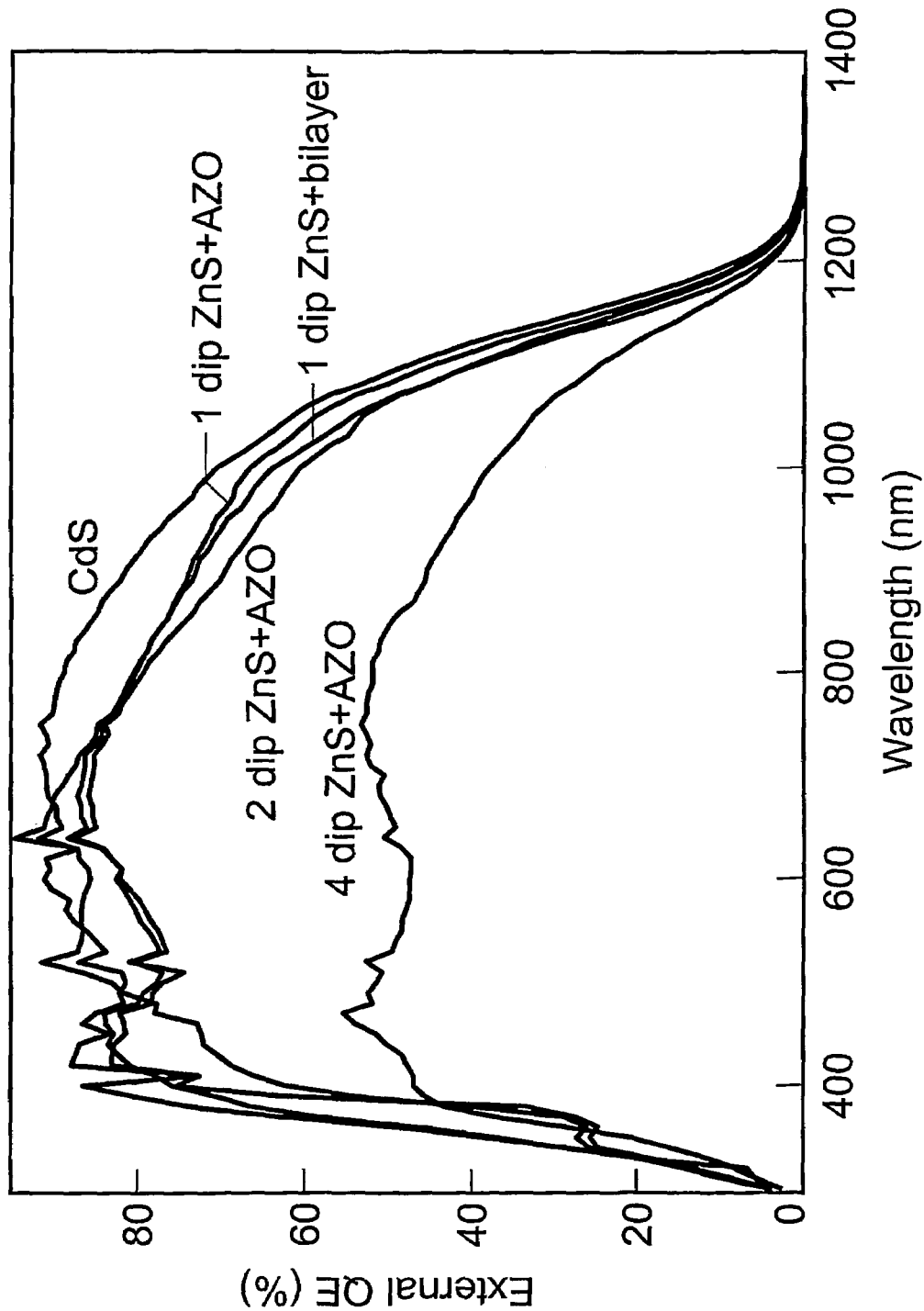
FIG. 6 is a QE of chemical bath deposition ZnS/CIGSS devices in accordance with an embodiment of the present invention.

FIG. 6 is a QE of chemical bath deposition ZnS/CIGSS devices in accordance with one embodiment of the present invention.

FIGS. 1-6 illustrate the utility of using a non-aqueous/aqueous solvent in either chemical bath deposition or spray deposition procedures. Note the high quality of deposited ZnS buffer layer useful in either CIGS or CIGSS absorbers.

Example 2

CIGS Absorber with ZnS Buffer Layer

A CIGS absorber was fabricated with a ZnS buffer layer using the deposition parameters disclosed in Example 1 (having a non aqueous/aqueous solvent composed of 31% methanol). The thickness of the ZnS/Zn(O, OH)S buffer layer was about 300 Å. The deposited ZnS/Zn(O,OH)S layer was annealed in air at 200° C. for 10 minutes. The device was completed with a conducting Al doped conducting ZnO layer.

Figure 7:
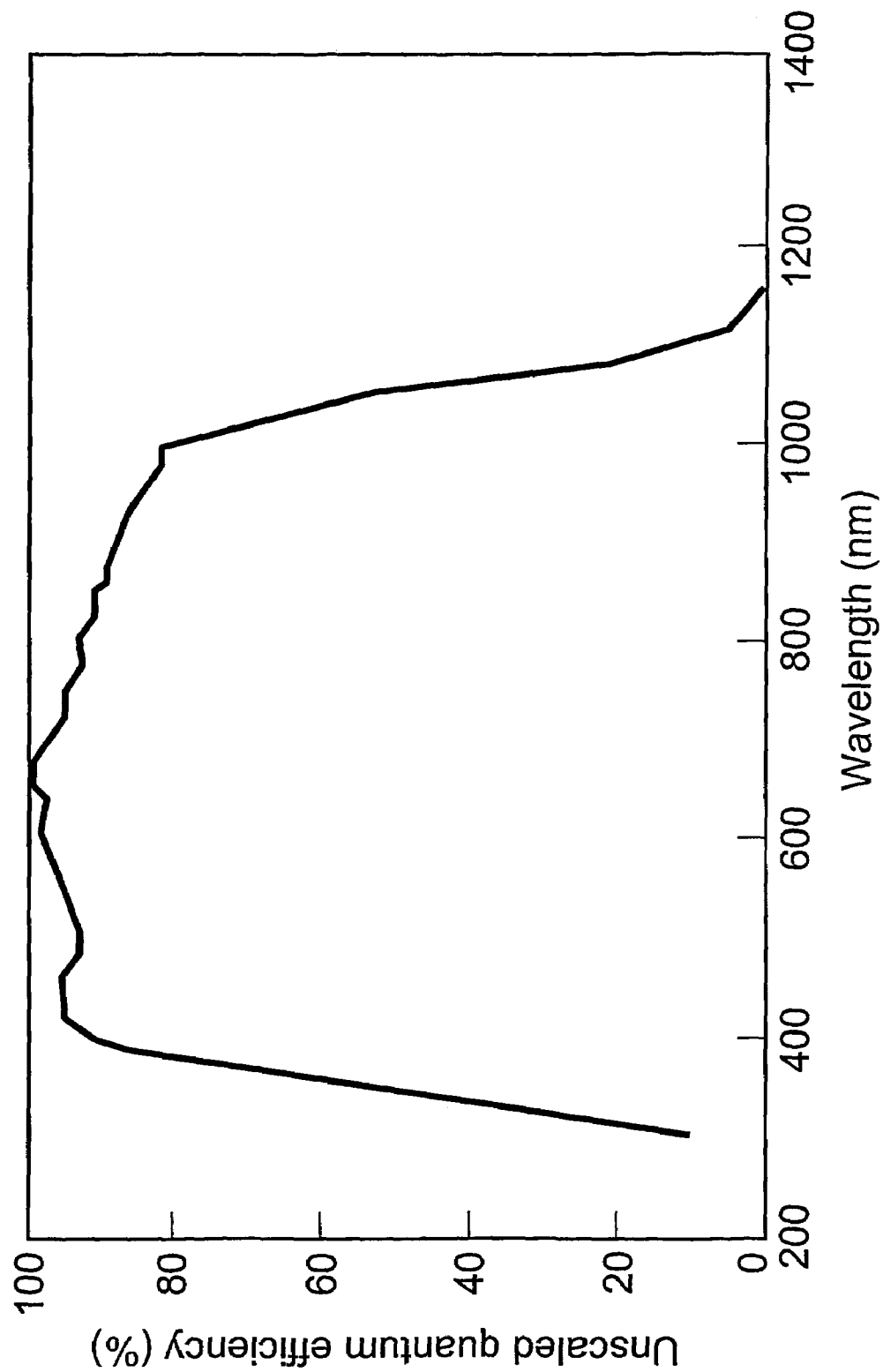
FIG. 7 is a QE of a 17.4% efficient chemical bath deposition ZnS/CIGS device in accordance with an embodiment of the present invention.
Figure 8:
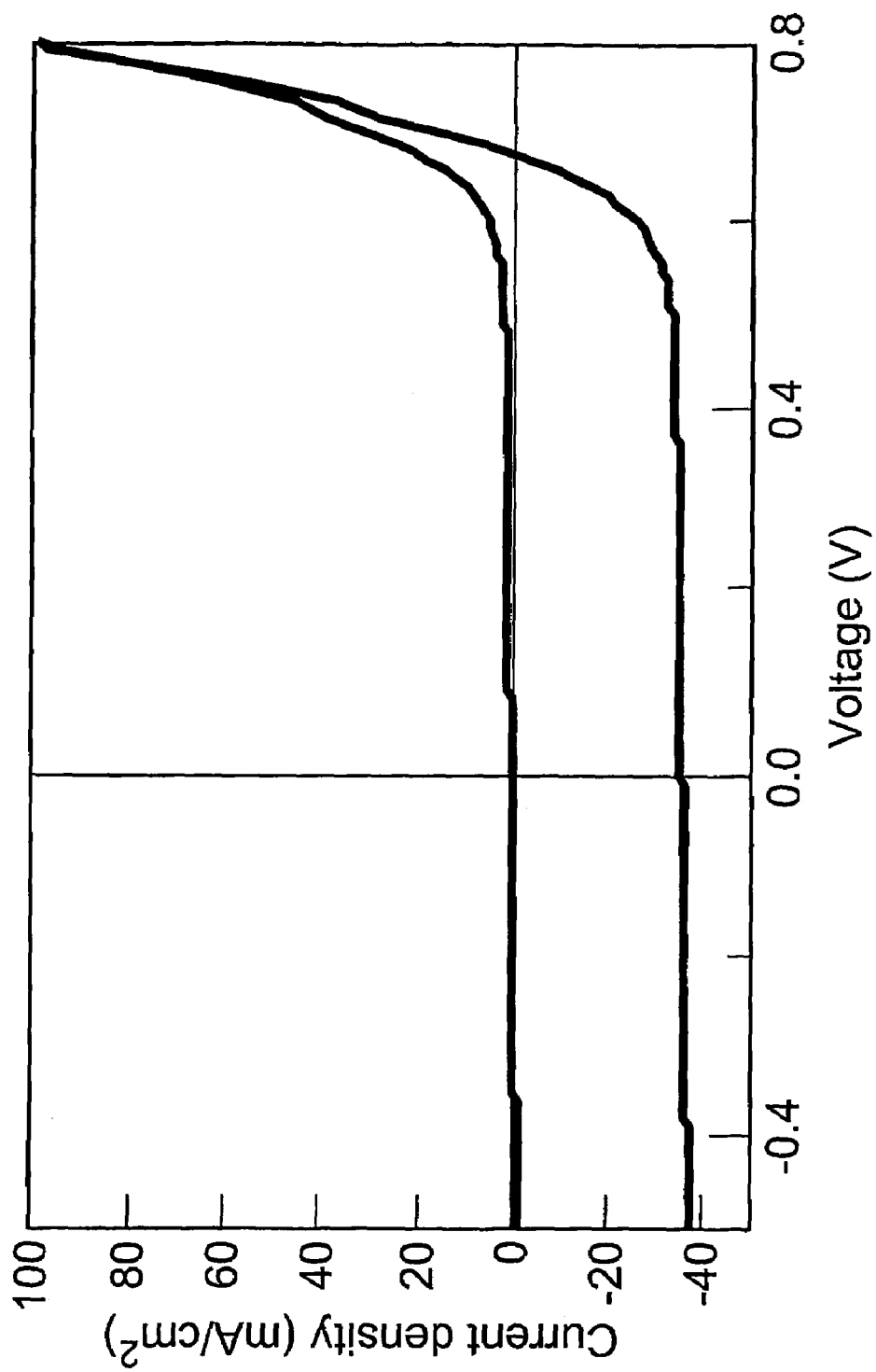
FIG. 8 is a data plot of Current density versus Voltage of a 17.4% efficient device using chemical bath deposition ZnS/CIGS in accordance with an embodiment of the present invention.

The final device structure is Mo/Glass/CIGSS/ZnS [Zn (O, OH)S]/ZnO/Metal grid Contact (Ni/Al). As shown in FIG. 7, a spectral response curve of the absorber has lower absorption values at short wavelengths due to a high bandgap of ZnS. FIG. 8 provides a J-V curve of the same device, having an efficiency of 17.4% (Voc=0.678V, Jsc=35.74 mA/cm$^2$, FF=71.7%).

This Example illustrates the utility of depositing ZnS by chemical bath deposition using a 31% methanol solvent. A conversion efficiency of 17.4% was achieved for the device, comparable to CIGS/CdS absorbers.

Example 3

CIGSS Absorber with ZnS Buffer Layer

Figure 9:
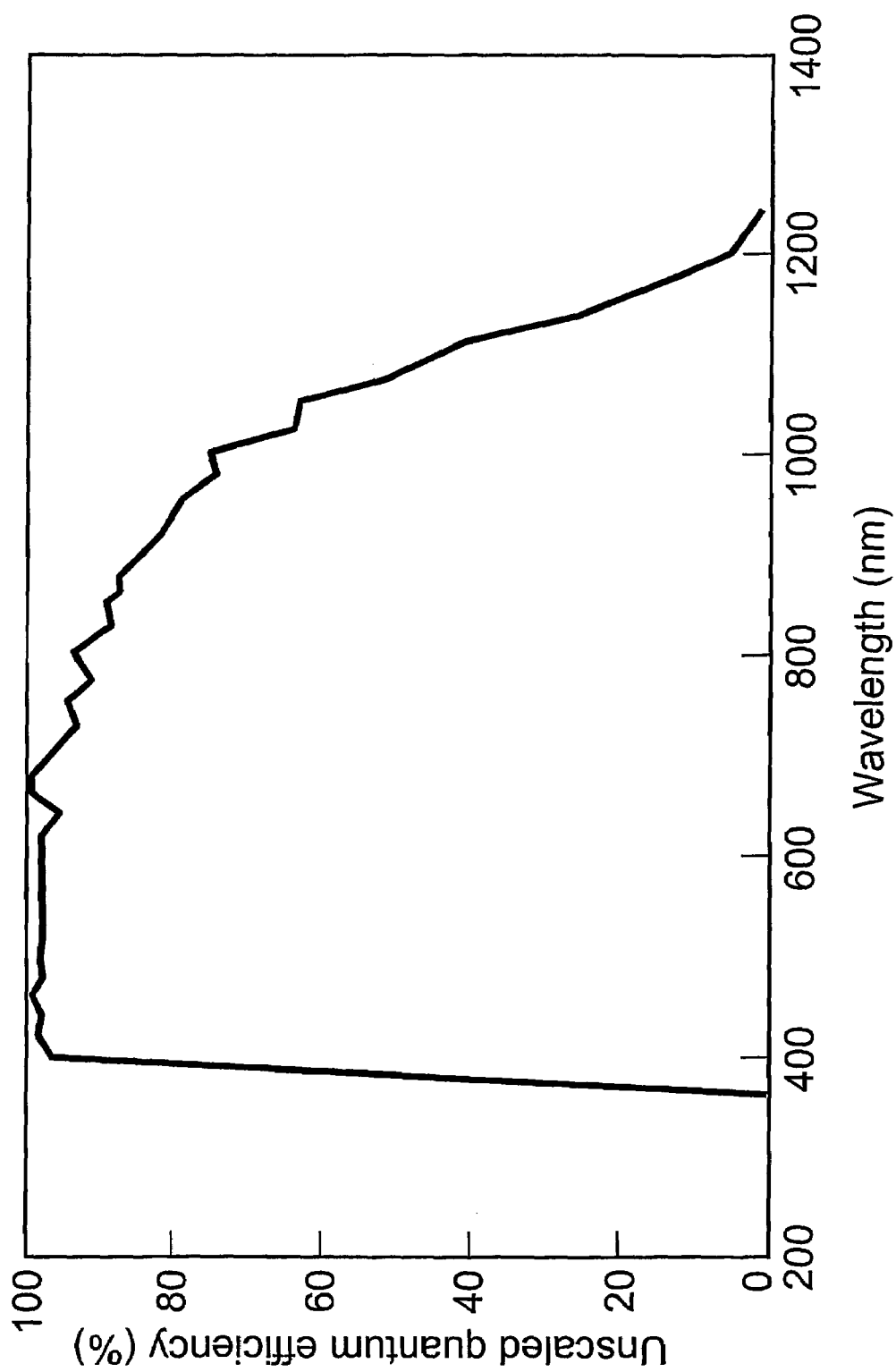
FIG. 9 is a QE of a 14.4% efficient chemical bath deposited ZnS/CIGSS device in accordance with an embodiment of the present invention.
Figure 10:
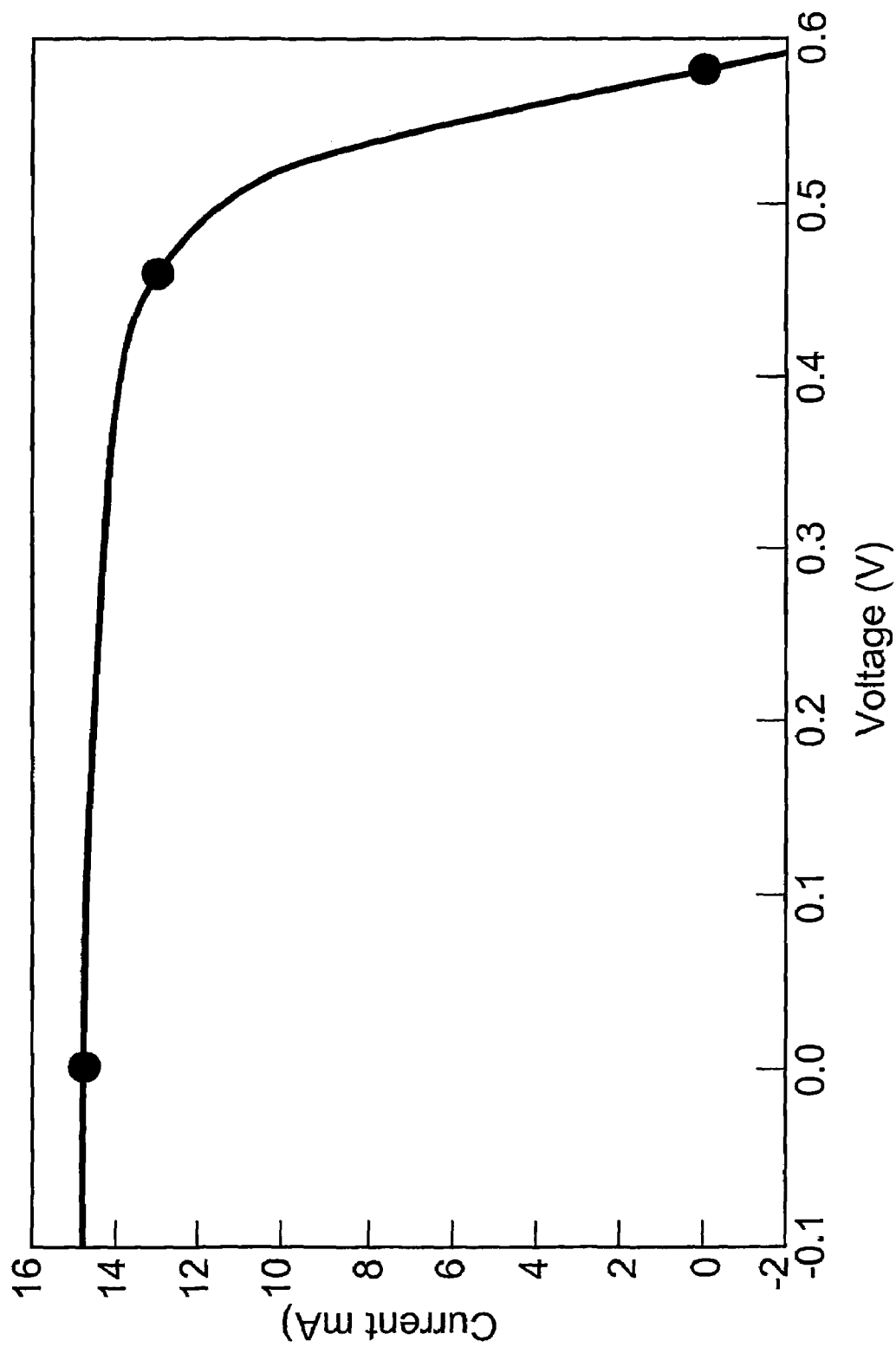
FIG. 10 is a data plot of Current density versus Voltage of a 14.4% efficient device using chemical bath deposition ZnS/CIGSS in accordance with an embodiment of the present invention.

A CIGSS absorber was fabricated with a ZnS buffer layer using deposition parameters disclosed above, using a non-aqueous/aqueous solvent of 31% methanol. The thickness of the ZnS buffer layer was about 300 Å. The device was completed with a conducting Al doped conducting ZnO layer. The final device structure is Mo/Glass/CIGSS/ZnS [Zn (O, OH)S]/ZnO/Metal grid Contact (Ni/Al). As shown in FIG. 9, a spectral response curve on the absorber shows lower absorption values at shorter wavelengths due to the high bandgap of ZnS. FIG. 10 provides a J-V curve of the same device, having an efficiency of 14.4% (Voc=0.5818V, Jsc=34.738 mA/cm$^2$, FF=71.18%).

This Example illustrates the utility of depositing ZnS by chemical bath deposition using a 31% methanol solvent. The ZnS was deposited in one step and had excellent coverage. A conversion efficiency of 14.4% was achieved for the device, comparable to CIGSS/CdS absorbers.

Several other ZnS or Zn(O,OH)S/CIGSS devices were prepared as above (using 31% methanol as the solvent) using the additional parameters shown in Table 2. Note that efficiency varied greatly dependent on sequence of ZnSO$_4$ and thiourea addition, and with processing temperatures. The data again showing the utility of the present invention.

TABLE 2

Chemical Bath Deposition ZnS/c-ZnO/CIGSS

| Sequence of Addition | Number of Layers | Processing Condition After CBD ZnS Layer | Efficiency (%) |
|---|---|---|---|
| ZnSO$_4$/Thiourea | 1 | None | 14.4 |
| ZnSO$_4$/Thiourea | 1 | Anneal at 200° C. in air for 10 min | 9.52 |
| ZnSO$_4$/Thiourea | 2 | None | 3.56 |
| ZnSO$_4$/Thiourea | 2 | Anneal at 200° C. in air for 10 min | 3.1 |
| Thiourea/ZnSO$_4$ | 1 | None | 13.2 |
| Thiourea/ZnSO$_4$ | 1 | Anneal at 200° C. in air for 10 min | 9.87 |
| Thiourea/ZnSO$_4$ | 2 | None | 1.72 |
| Thiourea/ZnSO$_4$ | 2 | Anneal at 200° C. in air for 10 min | 8.95 |

It will be clear that the invention is well adapted to attain the ends and advantages mentioned as well as those inherent therein. While a presently preferred embodiment has been described for purposes of disclosure, various changes and modifications may be made which will readily suggest themselves to those skilled in the art and which are encompassed in the spirit of the invention disclosed herein and as defined in the appended claims.

This specification contains numerous citations to patents and publications. Each is hereby incorporated by reference in their entirety for all purposes.

The invention claimed is:

1. A composition for deposition of a ZnS/Zn(O,OH)S film on a substrate comprising:
    a zinc salt;
    a source of sulfur;
    an amine; and
    a solvent comprising at least a portion of a non-aqueous material;
    wherein the composition is deposited by a deposition process onto the substrate.

2. The composition of claim 1 wherein the solvent is at least partially composed of an alcohol.

3. The composition of claim 2 wherein the alcohol is selected from the group consisting of methanol, isopropanol, and mixtures thereof.

4. The composition of claim 3 wherein the solvent contains at least 1% methanol.

5. The composition of claim 4 wherein the non-aqueous/aqueous solvent contains at least 31% methanol.

6. The composition of claim 4 wherein the solvent contains 100% methanol.

7. The composition of claim 1 wherein the composition is deposited by chemical bath deposition.

8. The composition of claim 1 wherein the composition is deposited by spray deposition.

9. The composition of claim 1 wherein the amine is ammonium hydroxide.

10. The composition of claim 1 wherein the solvent is at least partially composed of triethyl amine.

11. A method for depositing a ZnS/Zn(O,OH)S film on a substrate comprising:
    combining a zinc salt, an amine, and a sulfur source in a solvent comprising at least a potion of an organic material wherein the resultant solution is contacted to the substrate to fabricate a ZnS/Zn(O,OH)S film on the substrate.

12. The method of claim 11 wherein the contacting step is accomplished by spraying.

13. The method of claim 11 wherein the contacting step is accomplished by dipping.

14. The method of claim 11 further comprising cleaning the deposited ZnS/Zn(O,OH)S film with ultrasound.

15. The method of claim 11 wherein the ultrasound is performed on the ZnS/Zn(O,OH)S film for between ten and sixty seconds.

16. The method of claim 11 wherein the ultrasound is performed during the deposition of ZnS/Zn(O,OH)S film.

17. The method of claim 11 wherein the contact is performed once.

18. The method of claim 11 wherein annealing is performed of the deposited ZnS/Zn(O,OH)S layer.

19. The method of claim 11 wherein annealing at 200° C. for 10 minutes is performed on the deposited ZnS/Zn(O,OH)S layer.

20. The method of claim 11 wherein as deposited ZnS/Zn(O,OH)S layer was used for final junction formation.

* * * * *